United States Patent
Yu et al.

(10) Patent No.: US 8,072,755 B2
(45) Date of Patent: Dec. 6, 2011

(54) AIRFLOW-ADJUSTABLE ACTIVE HEAT-DISSIPATING MECHANISM AND ELECTRONIC DEVICE HAVING SAME

(75) Inventors: Wen-Lung Yu, Taoyuan Hsien (TW); Kuan-Sheng Wang, Taoyuan Hsien (TW); Chun-Chen Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 105 days.

(21) Appl. No.: 12/764,308

(22) Filed: Apr. 21, 2010

(65) Prior Publication Data

US 2010/0315778 A1 Dec. 16, 2010

(30) Foreign Application Priority Data

Jun. 11, 2009 (TW) ................................ 98119652 A

(51) Int. Cl.
*H05K 7/20* (2006.01)
*F04D 29/40* (2006.01)
*F04D 17/00* (2006.01)

(52) U.S. Cl. ...... 361/695; 415/176; 415/203; 415/213.1; 417/423.3; 454/184; 361/694

(58) Field of Classification Search .......... 361/694–695; 454/184
See application file for complete search history.

(56) References Cited

U.S. PATENT DOCUMENTS

| 5,218,513 | A | * | 6/1993 | Brown | 361/689 |
|---|---|---|---|---|---|
| 6,021,042 | A | * | 2/2000 | Anderson et al. | 361/695 |
| 6,220,872 | B1 | * | 4/2001 | Chen | 439/76.1 |
| 6,704,199 | B2 | * | 3/2004 | Wiley | 361/695 |
| 7,215,542 | B2 | * | 5/2007 | Chen et al. | 361/694 |
| 7,218,140 | B1 | * | 5/2007 | Young | 326/38 |
| 7,361,081 | B2 | * | 4/2008 | Beitelmal et al. | 454/184 |
| 7,813,128 | B2 | * | 10/2010 | Marchand | 361/694 |
| 2003/0030980 | A1 | * | 2/2003 | Bird et al. | 361/694 |
| 2006/0012957 | A1 | * | 1/2006 | Arbogast et al. | 361/695 |
| 2008/0080143 | A1 | * | 4/2008 | Peng et al. | 361/719 |
| 2008/0212292 | A1 | * | 9/2008 | Yu et al. | 361/748 |
| 2008/0266792 | A1 | * | 10/2008 | Li et al. | 361/695 |

* cited by examiner

*Primary Examiner* — Gregory Thompson
(74) *Attorney, Agent, or Firm* — Kirton & McConkie; Evan R. Witt

(57) ABSTRACT

An active heat-dissipating mechanism includes a fan module, an airflow-guiding part and an airflow shunt part. The fan module includes an airflow inlet and an airflow outlet. The airflow-guiding part is disposed at the same side of the airflow outlet of the fan module and in communication with the fan module. An airflow channel is defined by the airflow-guiding part. An airflow inhaled by the fan module is guided to a hotspot region of the electronic device through the airflow channel so as to remove the heat generated from the hotspot region. The airflow shunt part is formed on the airflow-guiding part. The airflow shunt part defines a stopping block in the airflow channel. A portion of the airflow is hindered by the stopping block and guided into a sub-hotspot region of the electronic device so as to remove the heat generated from the sub-hotspot region.

20 Claims, 4 Drawing Sheets

AIRFLOW-ADJUSTABLE ACTIVE HEAT-DISSIPATING MECHANISM AND ELECTRONIC DEVICE HAVING SAME

FIELD OF THE INVENTION

The present invention relates to an active heat-dissipation mechanism of an electronic device, and more particularly to an airflow-adjustable active heat-dissipation mechanism of an electronic device.

BACKGROUND OF THE INVENTION

With increasing integration of integrated circuits, electronic devices such as power adapters and power supply apparatuses are developed toward minimization. As the volume of the electronic device is decreased, the problem associated with heat dissipation becomes more serious. Take a power adapter for example. The conventional power adapter comprises an upper housing and a lower housing, which are made of plastic materials and cooperatively define a closed space for accommodating a printed circuit board. When the power adapter operates, the electronic components (e.g. transistors) on the printed circuit board may generate energy in the form of heat, which is readily accumulated within the closed space and usually difficult to dissipate away. If the power adapter fails to transfer enough heat to ambient air, the elevated operating temperature may result in damage of the electronic components, a breakdown of the whole power adapter or reduced power conversion efficiency.

For removing the heat generated from the electronic device to the ambient air, the electronic device is usually provided with an active heat-dissipation mechanism. The active heat-dissipation mechanism uses an external driving device (e.g. a fan) to inhale the external cooling air to cool the electronic components or exhaust the hot air inside the housing to the ambient air. For example, an air-intake type axial flow fan is usually disposed on a surface of the housing of the electronic device for introducing airflow into the inner portion of the electronic device and then exhausting the hot airflow through an opposite surface of the housing.

The conventional active heat-dissipation mechanism, however, still has some drawbacks. For example, since the airflow fails to be centralized to pass through the higher power component, the heat-dissipating efficiency is usually unsatisfied. In addition, the electronic components arranged at the downstream of the airflow path are usually suffered from a heat pollution problem. Under this circumstance, the heat generated from these electronic components fails to be uniformly dissipated. Moreover, the use of the fan generates undesired noise.

There is a need of providing an airflow-adjustable active heat-dissipation mechanism of an electronic device to obviate the drawbacks encountered from the prior art.

SUMMARY OF THE INVENTION

It is an object of the present invention to provide an airflow-adjustable active heat-dissipation mechanism for centralizing the airflow to the higher power component, thereby enhancing the heat-dissipating efficiency and uniformly removing heat.

Another object of the present invention provides an airflow-adjustable active heat-dissipation mechanism with reduced noise.

In accordance with a first aspect of the present invention, there is provided an active heat-dissipating mechanism for use in an electronic device. The active heat-dissipating mechanism includes a fan module, an airflow-guiding part and an airflow shunt part. The fan module includes an airflow inlet and an airflow outlet. The airflow-guiding part is disposed at the same side of the airflow outlet of the fan module and in communication with the fan module. An airflow channel is defined by the airflow-guiding part. An airflow inhaled by the fan module is guided to a hotspot region of the electronic device through the airflow channel so as to remove the heat generated from the hotspot region. The airflow shunt part is formed on the airflow-guiding part. The airflow shunt part defines a stopping block in the airflow channel. A portion of the airflow is hindered by the stopping block and guided into a sub-hotspot region of the electronic device so as to remove the heat generated from the sub-hotspot region.

In accordance with a second aspect of the present invention, there is provided an electronic device. The electronic device includes a power input part, a power output part, a circuit board, multiple electronic components and an active heat-dissipating mechanism. The electronic components include at least one higher power component. The higher power component is disposed at a hotspot region. The active heat-dissipating mechanism includes a fan module, an airflow-guiding part and an airflow shunt part. The fan module includes an airflow inlet and an airflow outlet. The airflow-guiding part is disposed at the same side of the airflow outlet of the fan module and in communication with the fan module. An airflow channel is defined by the airflow-guiding part. An airflow inhaled by the fan module is guided to the hotspot region through the airflow channel so as to remove the heat generated from the hotspot region. The airflow shunt part is formed on the airflow-guiding part. The airflow shunt part defines a stopping block in the airflow channel. A portion of the airflow is hindered by the stopping block and guided into a sub-hotspot region of the electronic device so as to remove the heat generated from the sub-hotspot region.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
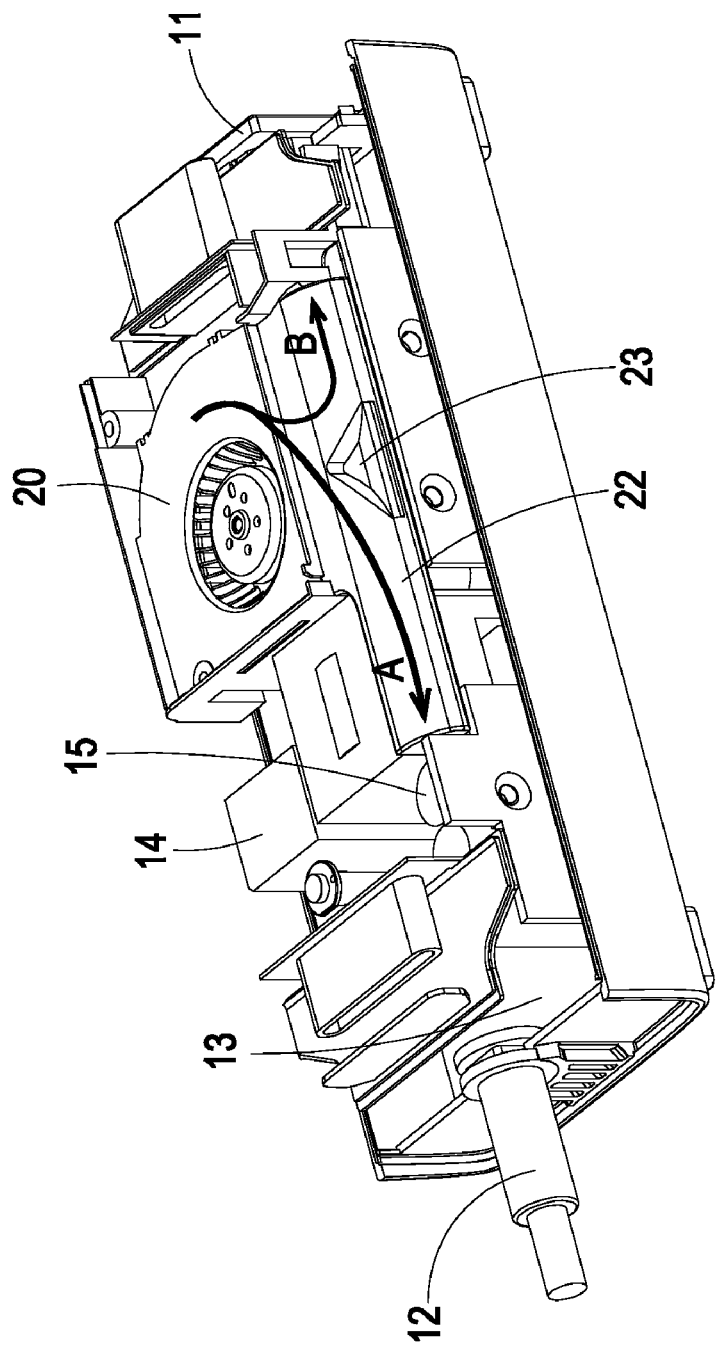
FIG. 1 is schematic perspective view illustrating an electronic device having an airflow-adjustable active heat-dissipating mechanism of the present invention.

FIG. 1 is schematic perspective view illustrating an electronic device having an airflow-adjustable active heat-dissipating mechanism of the present invention. An example of the electronic device includes but is not limited to a power adapter, a power supply apparatus or any other electronic device having the active heat-dissipation mechanism. For clarification, the upper housing of the electronic device is not shown in the drawing.

As shown in FIG. 1, the electronic device 10 includes a power input part 11, a power output part 12, a circuit board 13, several electronic components 14, 15, and an airflow-adjustable active heat-dissipating mechanism 20. An example of the power input part 11 includes but is not limited to a power socket. The power output part 12 is for example a power wire. The electronic component 15 is a higher power component such as a transistor. The airflow-adjustable active heat-dissipating mechanism 20 is used for guiding airflow to remove the heat generated from the electronic component 15.

Figure 2:
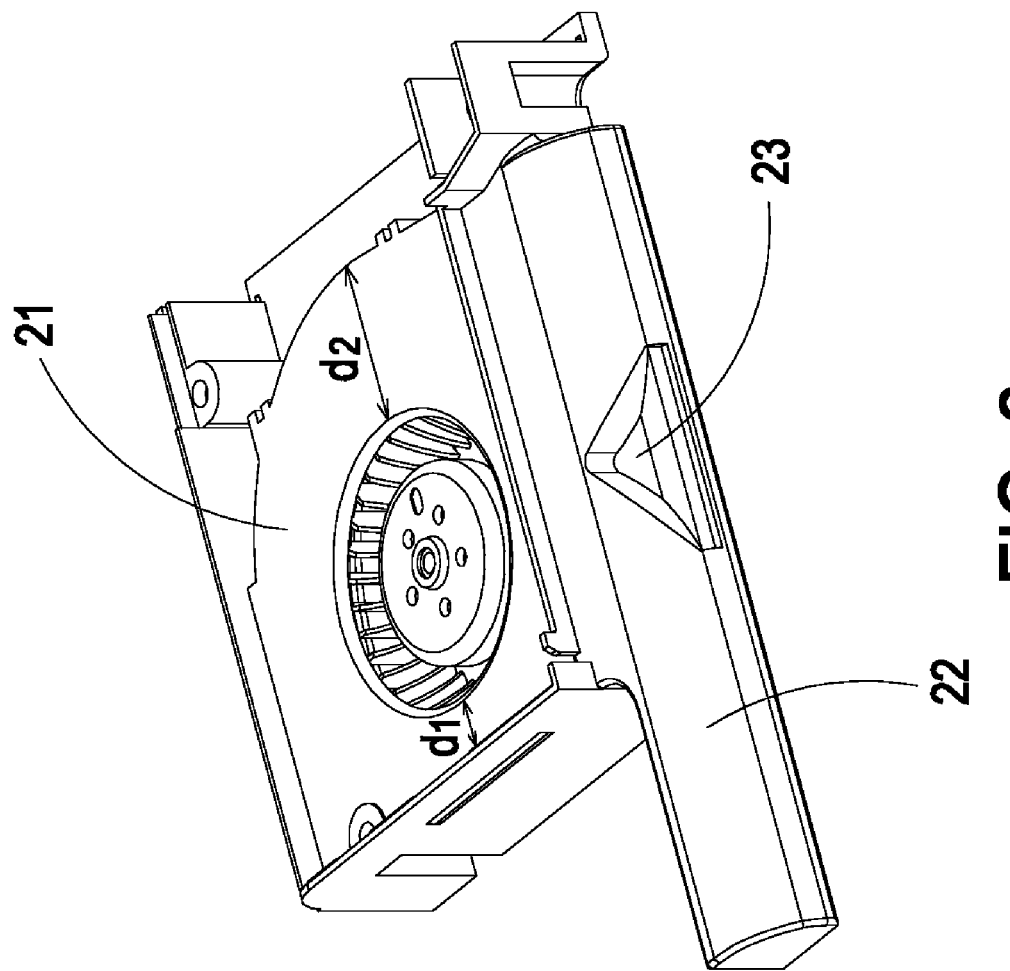
FIG. 2 is a schematic perspective view illustrating an airflow-adjustable active heat-dissipating mechanism according to an embodiment of the present invention.
Figure 3:
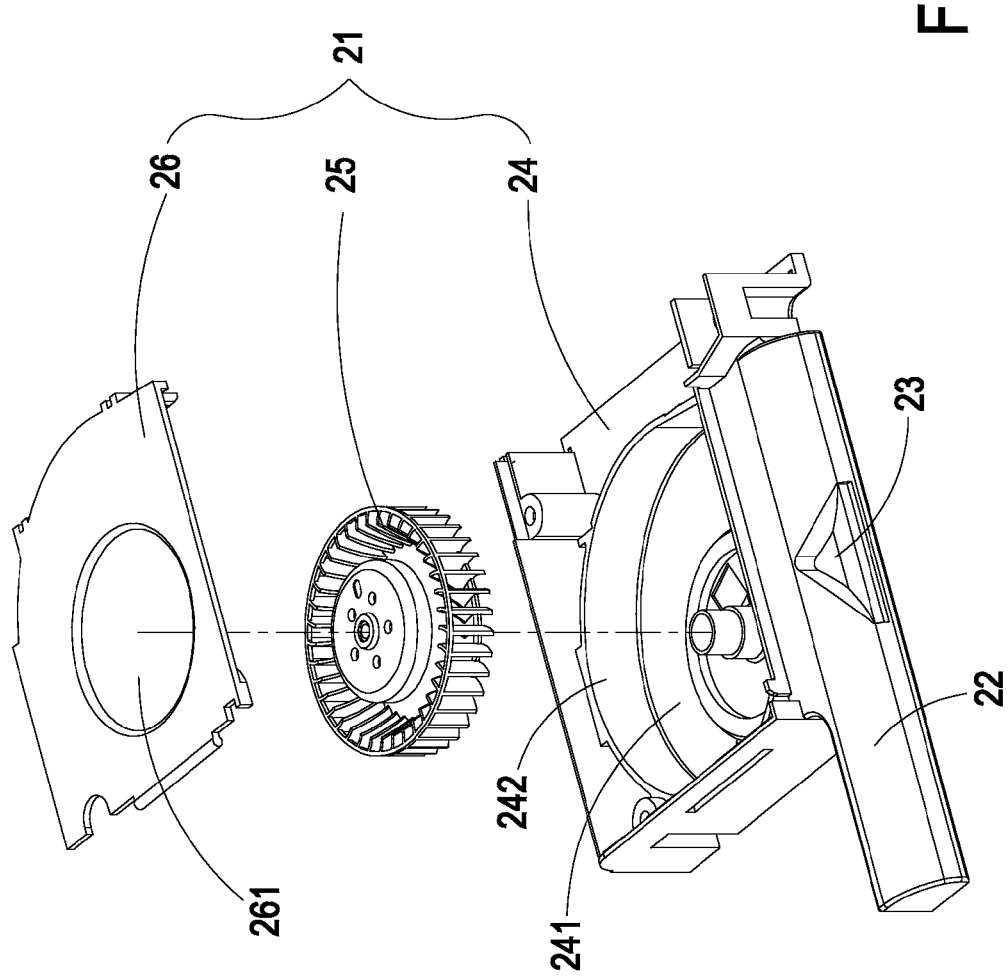
FIG. 3 is a schematic exploded view of the airflow-adjustable active heat-dissipating mechanism as shown in FIG. 2.
Figure 4:
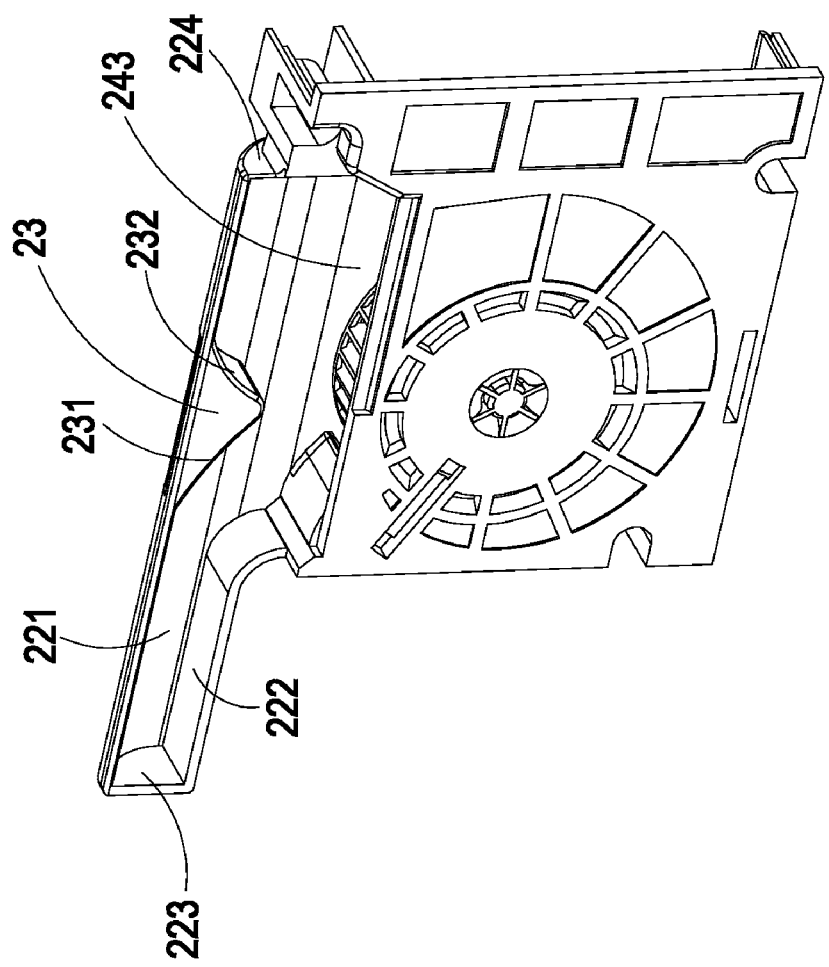
FIG. 4 is a schematic backside view of the airflow-adjustable active heat-dissipating mechanism as shown in FIG. 2.

FIG. 2 is a schematic perspective view illustrating an airflow-adjustable active heat-dissipating mechanism according to an embodiment of the present invention. FIG. 3 is a schematic exploded view of the airflow-adjustable active heat-dissipating mechanism as shown in FIG. 2. FIG. 4 is a schematic backside view of the airflow-adjustable active heat-dissipating mechanism as shown in FIG. 2. Please refer to FIGS. 2, 3 and 4. The airflow-adjustable active heat-dissipating mechanism 20 comprises a fan module 21, an airflow-guiding part 22 and an airflow shunt part 23. The fan module 21 is a substantially a non-axial flow fan such as a centrifugal fan or a blower fan. The non-axial flow fan intakes airflow in the direction parallel to the shaft but exhausts the airflow through the outlet that is formed in a sidewall. In this embodiment, the fan module 21 comprises a base 24, a fan blade set 25 and a cover plate 26. The base 24 includes a receptacle 241 and a frame 242. The receptacle 241 is defined within the frame 242 for accommodating the fan blade set 25. After the fan blade set 25 is accommodated within the receptacle 241, the cover plate 26 is placed on the base 24 and the fan blade set 25. The cover plate 26 has an opening 261 used as an airflow inlet of the airflow-adjustable active heat-dissipating mechanism 20. In addition, another opening 243 is formed in a sidewall of the frame 242 to be used as an airflow outlet of the fan module 21 (see FIG. 4).

Please refer to FIG. 2 again. The airflow-guiding part 22 and the airflow shunt part 23 are in communication with the base 24 of the fan module 21. In addition, the airflow-guiding part 22 and the airflow shunt part 23 are arranged at the same side as the airflow outlet 243 of the fan module 21. For reducing fabricating cost, structural gap and/or noise generation, the airflow-guiding part 22 and the airflow shunt part 23 are integrally formed with the fan module 21.

The airflow-guiding part 22 is substantially a slender structure. The airflow-guiding part 22 is in communication with the airflow outlet 243 of the fan module 21 and laterally extended from the airflow outlet 243. The airflow-guiding part 22 has an extension part, which is laterally extended from the airflow outlet 243 and protruded over the fan module 21. As shown in FIG. 4, the airflow-guiding part 22 comprises an arc-shaped surface 221, an extension surface 222, a first lateral surface 223 and a second lateral surface 224, which collectively define an airflow channel. The upper edge of the arc-shaped surface 221 is connected with the cover plate 26 of the fan module 21. The extension surface 222 is an inner surface of the extension part. The extension surface 222 is connected with the arc-shaped surface 221. The first lateral surface 223 and the second lateral surface 224 are arranged on two lateral sides of the airflow-guiding part 22 and opposed to each other. In an embodiment, the first lateral surface 223 and the second lateral surface 224 are sector-shaped. It is noted that, however, those skilled in the art will readily observe that numerous modifications and alterations may be made while retaining the teachings of the invention. For example, the end of the airflow-guiding part 22 could be open. That is, the first lateral surface 223 is exempted from the airflow-guiding part 22.

The airflow shunt part 23 is formed on the airflow-guiding part 22 and aligned with the airflow outlet 243 of the fan module 21. The airflow shunt part 23 is substantially an internally concave structure of the arc-shaped surface 221 of the airflow-guiding part 22 (see FIGS. 2 and 4). The airflow shunt part 23 includes a first curvy plate 231 and a second curvy plate 232. The first curvy plate 231 and the second curvy plate 232 collectively define a triangular concave structure. In addition, the first curvy plate 231 and the second curvy plate 232 collectively define a stopping block within the airflow channel (see FIG. 4).

Since the fan module 21 is a non-axial flow fan, the airflow is inhaled into the receptacle 241 through the airflow inlet 261 of the cover plate 26 and exhausted out of the fan module 21 through the airflow outlet 243 during operations of the fan module 21. Please refer to FIG. 1 again. The extension part of the airflow-guiding part 22 is disposed in the vicinity of the higher power component 15 (e.g. a transistor). Since the higher power component 15 generates a great deal of heat during the operation of the electronic device 10, the region where the higher power component 15 is placed is also referred herein as a hotspot region. According to an elaborate design, the fan blade set 25 is rotated in a specified direction (e.g. a clockwise direction). Since the airflow-guiding part 22 is in communication with the airflow outlet 243 of the fan module 21, the airflow exhausted out of the fan module 21 through the airflow outlet 243 will be guided into the airflow channel and flow toward the extension part of the airflow-guiding part 22. In other words, the airflow is guided to the hotspot region by the airflow-guiding part 22 and thus the heat-dissipating efficiency of the electronic device 10 is enhanced. As a consequence, the power conversion efficiency and the use life of the electronic device 10 are increased.

Since the airflow shunt part 23 is formed on the airflow-guiding part 22, a portion of the airflow exhausted out of airflow outlet 243 will be hindered by the airflow shunt part 23 but flow along the second curvy plate 232 of the airflow shunt part 23. That is, the airflow will be guided to a sub-hotpot region in a direction opposite to the extension part of the airflow-guiding part 22. In this context, the sub-hotpot region is a region where lower power components are placed. An example of the lower power component is the power input part 11. Please refer to FIG. 1 again. Due to the airflow-guiding part 22 and the airflow shunt part 23, the airflow exhausted out of airflow outlet 243 will be divided into a main airflow path A and a minor airflow path B when the airflow collides with the airflow shunt part 23. The main airflow path A is directed to the electronic component at the hotspot region in order to enhance the efficiency of removing the heat generated from the hotspot region. Whereas, the minor airflow path B is directed to the electronic component at the sub-hotspot region in order to enhance the efficiency of removing the heat generated from the sub-hotspot region. Therefore, the airflow of the active heat-dissipating mechanism 20 is adjustable. In addition, the airflow could be centralized and controlled in order to uniformly dissipate heat.

In the above embodiments, the extension part of the airflow-guiding part 22 is disposed in the vicinity of the higher power component 15. Depending on the layout configuration of the electronic device, the shape of the extension part of the airflow-guiding part 22 could be varied as required. Moreover, the location of the airflow shunt part 23 could be adjusted according to the practical requirements in order to control the ratio of the airflow amount of the main airflow path A to the airflow amount of the minor airflow path B.

Since the airflow-guiding part 22 has the arc-shaped surface 221 and the upper edge of the arc-shaped surface 221 is connected with the cover plate 26 of the fan module 21, the airflow will be downwardly guided toward the hotspot region to remove the heat generated from the higher power components. In addition, the arc-shaped surface 221 could facilitate reducing air resistance, reducing wind-shear and minimize the undesired noise. Similarly, the first curvy plate 231 and the second curvy plate 232 of the airflow shunt part 23 could facilitate guiding the airflow and reduce the undesired noise.

Moreover, the fan blade set 25 is not disposed at the middle of the receptacle 241. Whereas, the fan blade set 25 is eccentrically disposed within the receptacle 241. As shown in FIGS. 2 and 3, the fan blade set 25 is closer to the left side of the frame 242. For example, the distance d1 between the left side of the frame 242 and the fan blade set 25 is shorter than the distance d2 between the right side of the frame 242 and the fan blade set 25. As a consequence, the airflow amount guiding to the extension part of the airflow-guiding part 22 is increased.

From the above description, the active heat-dissipating mechanism of the present invention includes a fan module, an airflow-guiding part and an airflow shunt part. The fan module includes an airflow inlet and an airflow outlet. The airflow-guiding part is disposed at the same side of the airflow outlet of the fan module and in communication with the outlet of the fan module. The end of the airflow-guiding part is disposed in the in the vicinity of the hotspot region where the higher power component is placed. During operations of the fan module, the airflow is guided to the hotspot region along the airflow channel. As a consequence, the heat-dissipating efficiency of the electronic device is enhanced, and the power conversion efficiency and the use life of the electronic device are increased. In addition, the airflow shunt part could facilitate guiding a portion of airflow to the sub-hotspot region of the electronic device. Moreover, the airflow of the active heat-dissipating mechanism is adjustable, and the airflow could be centralized and controlled in order to uniformly dissipate heat. The airflow-guiding part and the airflow shunt part are integrally formed with the fan module, the airflow-guiding part has arc-shaped surface, and the airflow shunt part has curvy plates. As a consequence, air resistance, wind-shear and undesired noise are reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An active heat-dissipating mechanism for use in an electronic device, said heat-dissipating mechanism comprising:
    a fan module comprising an airflow inlet and an airflow outlet;
    an airflow-guiding part disposed at the same side of said airflow outlet of said fan module and in communication with said fan module, wherein an airflow channel is defined by said airflow-guiding part, and an airflow inhaled by said fan module is guided to a hotspot region of said electronic device through said airflow channel so as to remove the heat generated from said hotspot region; and
    an airflow shunt part formed on said airflow-guiding part, wherein said airflow shunt part defines a stopping block in said airflow channel, and a portion of said airflow is hindered by said stopping block and guided into a sub-hotspot region of said electronic device so as to remove the heat generated from said sub-hotspot region.

2. The active heat-dissipating mechanism according to claim 1 wherein said fan module is a non-axial flow fan including a base, a fan blade set and a cover plate.

3. The active heat-dissipating mechanism according to claim 2 wherein said base includes a receptacle for accommodating said fan blade set.

4. The active heat-dissipating mechanism according to claim 3 wherein said fan blade set is eccentrically disposed within said receptacle.

5. The active heat-dissipating mechanism according to claim 2 wherein said airflow inlet is disposed in said cover plate.

6. The active heat-dissipating mechanism according to claim 2 wherein said airflow-guiding part is in communication with said base of said fan module.

7. The active heat-dissipating mechanism according to claim 2 wherein said airflow-guiding part and said airflow shunt part are integrally formed with said fan module.

8. The active heat-dissipating mechanism according to claim 2 wherein said airflow-guiding part includes an arc-shaped surface.

9. The active heat-dissipating mechanism according to claim 8 wherein an upper edge of said arc-shaped surface is connected with said cover plate of said fan module.

10. The active heat-dissipating mechanism according to claim 1 wherein said airflow shunt part includes a first curvy plate and a second curvy plate, which collectively define a triangular concave structure.

11. An electronic device comprising:
    a power input part;
    a power output part;
    a circuit board;
    multiple electronic components, wherein said electronic components include at least one higher power component, and said higher power component is disposed at a hotspot region; and
    an active heat-dissipating mechanism comprising:
        a fan module comprising an airflow inlet and an airflow outlet;
        an airflow-guiding part disposed at the same side of said airflow outlet of said fan module and in communication with said fan module, wherein an airflow channel is defined by said airflow-guiding part, and an airflow inhaled by said fan module is guided to said hotspot region through said airflow channel so as to remove the heat generated from said hotspot region; and
        an airflow shunt part formed on said airflow-guiding part, wherein said airflow shunt part defines a stopping block in said airflow channel, and a portion of said airflow is hindered by said stopping block and guided into a sub-hotspot region of said electronic device so as to remove the heat generated from said sub-hotspot region.

12. The electronic device according to claim 11 wherein said fan module is a non-axial flow fan including a base, a fan blade set and a cover plate.

13. The electronic device according to claim 12 wherein said base includes a receptacle for accommodating said fan blade set.

14. The electronic device according to claim 13 wherein said fan blade set is eccentrically disposed within said receptacle.

15. The electronic device according to claim 12 wherein said airflow inlet is disposed in said cover plate.

16. The electronic device according to claim 12 wherein said airflow-guiding part is in communication with said base of said fan module.

17. The electronic device according to claim 12 wherein said airflow-guiding part and said airflow shunt part are integrally formed with said fan module.

18. The electronic device according to claim 12 wherein said airflow-guiding part includes an arc-shaped surface.

19. The electronic device according to claim 18 wherein an upper edge of said arc-shaped surface is connected with said cover plate of said fan module.

20. The electronic device according to claim 11 wherein said airflow shunt part includes a first curvy plate and a second curvy plate, which collectively define a triangular concave structure.

* * * * *